(12) United States Patent
Maffitt et al.

(10) Patent No.: US 10,726,897 B1
(45) Date of Patent: Jul. 28, 2020

(54) TRIMMING MRAM SENSE AMP WITH OFFSET CANCELLATION

(71) Applicant: International Business Machines Corporation, Armonk, NY (US)

(72) Inventors: Thomas Martin Maffitt, Butlington, VT (US); John Kenneth Debrosse, Colchester, VT (US); Matthew R Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/411,909

(22) Filed: May 14, 2019

(51) Int. Cl.
*G11C 11/00* (2006.01)
*G11C 11/16* (2006.01)

(52) U.S. Cl.
CPC ................. *G11C 11/1673* (2013.01)

(58) Field of Classification Search
CPC ........ G11C 2013/0054; G11C 11/1673; G11C 11/5642; G11C 2211/5634
See application file for complete search history.

(56) References Cited

U.S. PATENT DOCUMENTS

| | | | |
|---|---|---|---|
| 5,917,754 A | 6/1999 | Pathak et al. | |
| 6,847,568 B2 | 1/2005 | Gogl et al. | |
| 7,239,537 B2 | 7/2007 | DeBrosse et al. | |
| 8,693,273 B2 | 4/2014 | Yuh et al. | |
| 9,378,795 B1* | 6/2016 | DeBrosse | G11C 11/1673 |
| 9,406,367 B2 | 8/2016 | Chih et al. | |
| 9,601,165 B1 | 3/2017 | Dray et al. | |
| 9,613,674 B2 | 4/2017 | DeBrosse | |
| 9,691,459 B2 | 6/2017 | Seo et al. | |
| 2005/0088878 A1* | 4/2005 | Eshel | G11C 16/28 365/185.28 |
| 2010/0014343 A1* | 1/2010 | Wei | G11C 13/0069 365/148 |
| 2012/0069633 A1* | 3/2012 | Katoh | G11C 13/004 365/148 |
| 2015/0179251 A1* | 6/2015 | Yoshimoto | G11C 13/0023 365/148 |
| 2018/0277209 A1* | 9/2018 | Lam | G11C 13/0026 |

* cited by examiner

*Primary Examiner* — Tuan T Nguyen
(74) *Attorney, Agent, or Firm* — Patterson + Sheridan, LLP

(57) ABSTRACT

A magnetoresistive random access memory (MRAM) system is described. The system includes a sense amplifier circuit for sensing a data state of an MRAM data cell. The circuit includes a first leg and a second leg, and is configured to perform a two-phase read including a first phase in which a first transistor is coupled to a reference resistance circuitry and a second transistor is coupled to a data resistance circuitry, and a second phase in which the first transistor is coupled to the data resistance circuitry and the second transistor is coupled to the reference resistance circuitry. The circuit further includes a reference trim circuitry and a data trim circuitry configured to correct for device mismatch errors relating to the two-phase read of the sense amplifier circuit. The circuit further includes a comparator circuit configured to output the data state of the data cell.

20 Claims, 8 Drawing Sheets

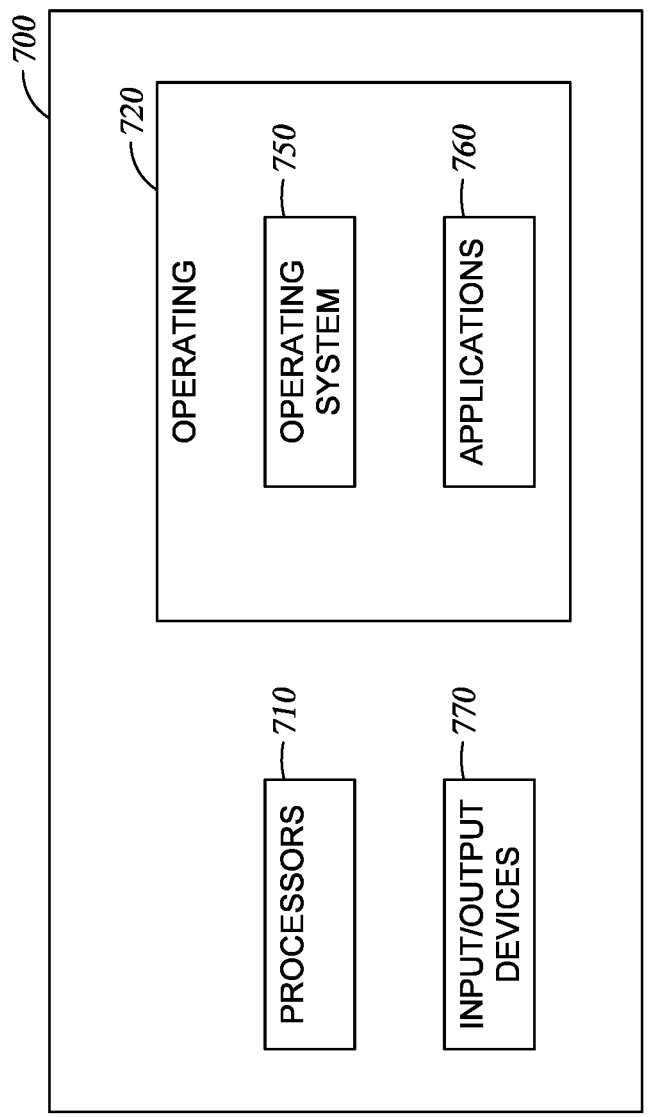

TRIMMING MRAM SENSE AMP WITH OFFSET CANCELLATION

BACKGROUND

The present disclosure relates to electronic memory technology, and more specifically, though not exclusively, to a sense amplifier for magnetoresistive random access memory (MRAM), with trimming for offset cancellation.

MRAM is an emerging memory technology, offering non-volatility, high performance, and high endurance. In one example, an MRAM cell includes two magnetic elements separated by a thin insulating layer. The polarity of one of the magnets is fixed, while the other can be changed. When the magnets are parallel the memory element has a lower resistance then the anti-parallel case. This difference in resistance can be read as memory bit in either a "0" or "1" state. The difference in resistance between states can vary depending on implementation and other factors, but may be equal to 2, i.e., a 100 percent change in resistance between the parallel and anti-parallel states.

In one form, MRAM uses spin-transfer torque (STT) techniques. A typical STT MRAM memory cell includes a magnetic tunnel junction in series with a field effect transistor (FET), which is gated by a word line. A bit line and a source line run parallel to each other and perpendicular to the word line. The bit line is connected to the magnetic tunnel junction, and the source line is connected to the FET. One memory cell along the bit line is selected by turning on its word line. When a relatively large voltage (e.g., 500 mV) is forced across the cell from bit line to source line, the selected cell's magnetic tunnel junction is written into a particular state, which is determined by the polarity of this voltage (bit line high vs. source line high).

When the cell is in a logic zero (0) or parallel state, its magnetic tunnel junction resistance is lower than when the cell is in a logic one (1) or anti-parallel state. Typical magnetic tunnel junction resistance values could include R0=5 KΩ and R1=10 KΩ. A selected cell is read by sensing the resistance from bit line to source line. The "sense" or "read" voltage is much lower than the write voltage in order to clearly distinguish write and read operations, and to avoid inadvertently disturbing the cell during a read operation. Thus, sensing methodologies are capable of accurately sensing very low read voltage (e.g., less than 50 mV). The combination of a small difference in resistance and sensing the difference at a low voltage makes the design of a MRAM read system very challenging.

SUMMARY

Embodiments described herein include a sense amplifier circuit for sensing a data state of a data cell. The circuit includes a first leg including a first transistor and a second leg including a second transistor. The sense amplifier circuit is configured to perform a two-phase read including: a first phase in which the first transistor is coupled to a reference resistance circuitry and the second transistor is coupled to a data resistance circuitry, and a second phase in which the first transistor is coupled to the data resistance circuitry and the second transistor is coupled to the reference resistance circuitry. The circuit further includes a reference trim circuitry coupled to the reference resistance circuitry and a data trim circuitry coupled to the data resistance circuitry, the reference trim circuitry and data trim circuitry configured to correct for device mismatch errors relating to the two-phase read of the sense amplifier circuit. The circuit further includes a comparator circuit configured to output the data state of the data cell based on input of a first voltage related to a reference resistance and a second voltage related to a data resistance.

Embodiments described herein further include a magnetoresistive random access memory (MRAM) system. The system includes a plurality of MRAM data cells. The system further includes a sense amplifier circuit for sensing a data state of a data cell of the plurality of MRAM data cells. The sense amplifier circuit includes a first leg including a first transistor and a second leg including a second transistor. The sense amplifier circuit is configured to perform a two-phase read including: a first phase in which the first transistor is coupled to a reference resistance circuitry and the second transistor is coupled to a data resistance circuitry, and a second phase in which the first transistor is coupled to the data resistance circuitry and the second transistor is coupled to the reference resistance circuitry. The circuit further includes a reference trim circuitry coupled to the reference resistance circuitry and a data trim circuitry coupled to the data resistance circuitry, the reference trim circuitry and data trim circuitry configured to correct for device mismatch errors relating to the two-phase read of the sense amplifier circuit. The circuit further includes a comparator circuit configured to output the data state of the data cell based on input of a first voltage related to a reference resistance and a second voltage related to a data resistance.

Embodiments described herein further include a method of reading data from a magnetoresistive random access memory (MRAM) system. The method includes performing a two phase read of a data state of a data cell using a sense amplifier circuit, the sense amplifier circuit including a first leg including a first transistor, a second leg including a second transistor, a reference trim circuitry, a data trim circuitry, and a comparator circuit. During a first phase of the two phase read the first transistor is coupled to a reference resistance circuitry and the second transistor is coupled to a data resistance circuitry. During a second phase of the two phase read the first transistor is coupled to the data resistance circuitry and the second transistor is coupled to the reference resistance circuitry. The reference trim circuitry is coupled to the reference resistance circuitry and the data trim circuitry is coupled to the data resistance circuitry, the reference trim circuitry and data trim circuitry configured to correct for device mismatch errors relating to the two-phase read of the sense amplifier circuit. The comparator circuit is configured to output the data state of the data cell based on input of a first voltage related to a reference resistance and a second voltage related to a data resistance.

BRIEF DESCRIPTION OF THE SEVERAL VIEWS OF THE DRAWINGS

FIG. 7 illustrates an example computer, according to one embodiment described herein.

DETAILED DESCRIPTION

As noted above, designing magnetoresistive random access memory (MRAM) read system can be very challenging. In particular, designing a sense amplifier suitable to detect the relatively small difference in resistance at a low voltage can be challenging. For example, FET mismatch between transistors in the sense amplifier can be significant enough to affect read accuracy. One or more techniques disclosed herein relate to a sense amplifier for an MRAM system, in which a two phase offset cancellation configuration is combined with trim devices to compensate for FET mismatch and other errors. While the illustrated embodiments focus on MRAM, one or more of the techniques disclosed herein are also suitable for other memory systems, particularly systems involving low differential resistance or low read voltage.

Figure 1A:
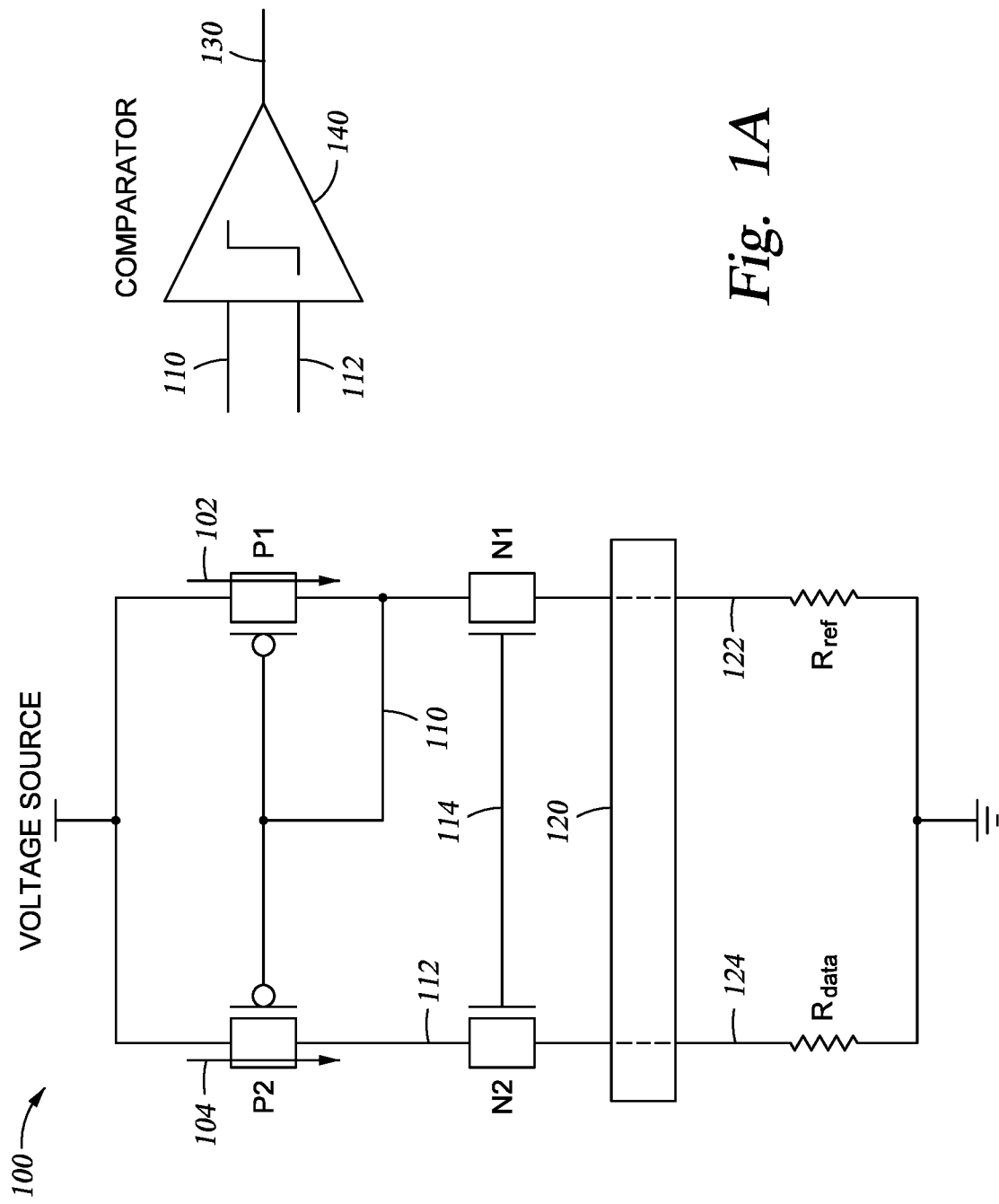
FIGS. 1A-1B illustrates MRAM sense amplifiers, according to one embodiment described herein.

FIG. 1A illustrates an MRAM sense amplifier 100, according to one embodiment described herein. The sense amplifier 100 is part of the read circuit of an MRAM system and is used when reading data from an MRAM cell. Reference and data currents are created by reference and data cells, respectively, at a fixed voltage. The change in current between the data and reference cells creates a voltage difference which corresponds to either a "0" or "1" data state.

The sense amplifier 100 includes a column decoder/multiplexer 120 and bit lines 122 and 124. The bit line 122 is a reference bit line while the bit line 124 is a data bit line. The resistor Rref is used for the reference bit line while the resistor Rdata is used for the data bit line. A pair of n-channel transistors N1 and N2 form a source-follower circuit that clamps the bit lines (or source lines depending on the preferred read polarity) to the target read voltage at the clamp 114. The difference between the data cell current 104 and the reference cell current 102 is converted to a voltage difference by a p-channel (positive channel FET) current mirror load circuit made up of p-channel transistors P1 and P2. This voltage difference between 110 and 112 is sensed by a comparator 140 to produce the digital sense amplifier output 130 (e.g., a "0" or "1" conveying the value stored by the MRAM cell).

FIG. 1A illustrates a 2-legged sense amplifier, with one data leg and one reference leg. Alternatively, the sense amplifier may be 3-legged, with one data leg and two reference legs. In this alternative, the values of the two reference legs are averaged and compared with the data leg.

The techniques illustrated in FIG. 1A, however, are sensitive to FET mismatch between the p-channel transistors P1 and P2 and between the n-channel transistors N1 and N2. For example, in FIG. 1A, a current 102 is sourced from the p-channel transistor P1 while a current 104 is sourced from the p-channel transistor P2. In an embodiment, FET mismatch between P1 and P2 can lead to variance between currents 102 and 104. FET mismatch is a common phenomenon influencing the performance of analog circuits. Despite the use of layout techniques to minimize mismatch, any two seemingly identical FETs will have slightly different values of threshold voltage and transconductance due to local variations in device dimensions, gate oxide thickness, channel doping, and other physical parameters. These mismatches result in finite random offsets in circuits which would otherwise have zero offset. Furthermore, as FET device technology scales, the sensitivity to FET mismatch can increase.

In the case of an MRAM sense amplifier (e.g., the sense amplifier 100), FET mismatch results in a degradation of read margin. The threshold data cell resistance (the data cell resistance at which the sense amplifier switches from an output of 0 to an output of 1) is moved from its ideal value. For example, the output 130 is proportional to the difference between the reference and data current, but with two error terms from the P1/P2 and N1/N2 pair mismatch errors. This error can be significant, causing sense amplifier to sense amplifier variations and as a consequence a variation in the signal margin and ultimately read robustness.

Figure 1B:
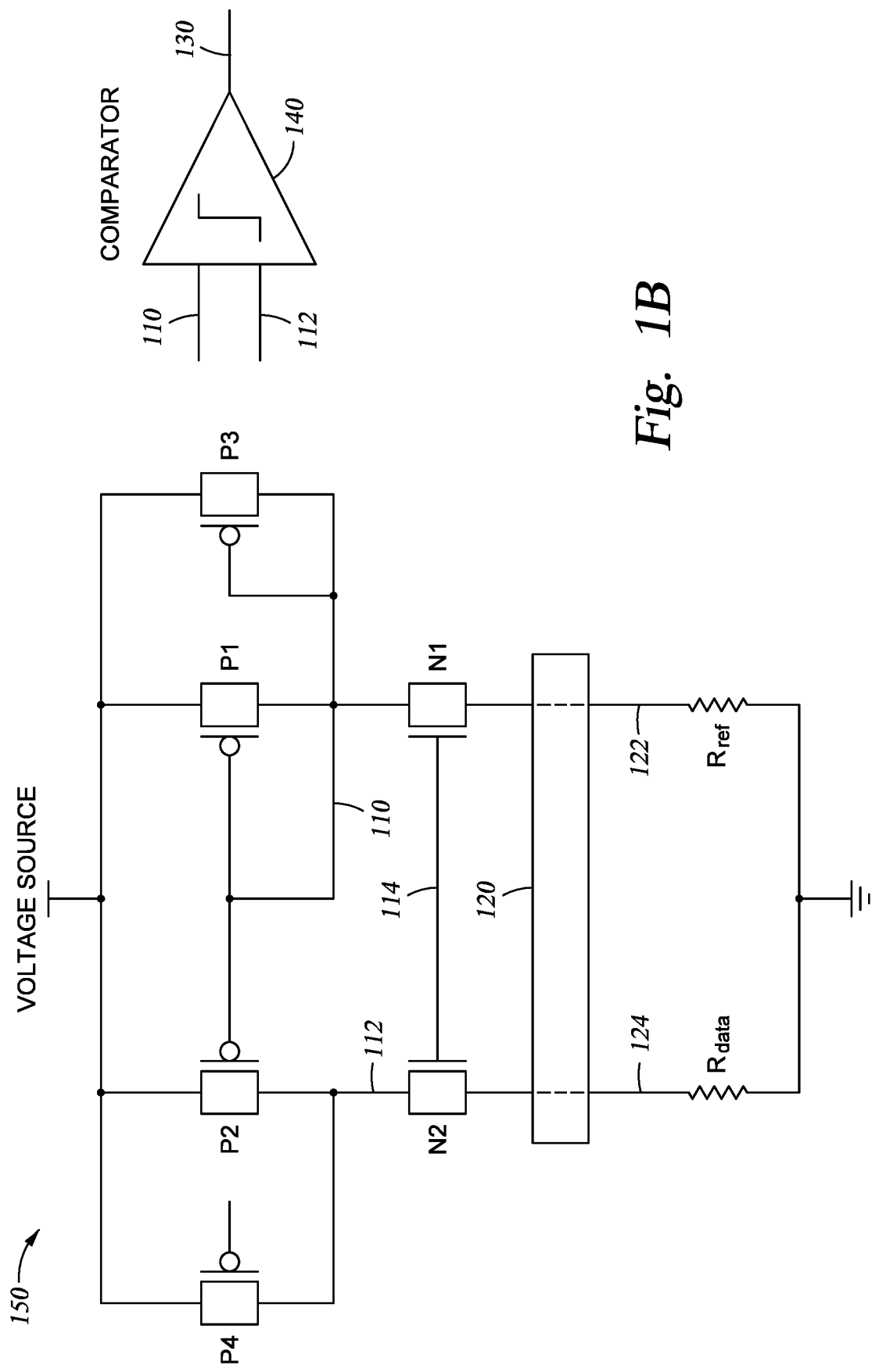

One possible solution is to trim out the effects of FET mismatch in an MRAM sense amplifier. FIG. 1B illustrates an MRAM sense amplifier 150 with additional trim transistors P3 and P4, according to one embodiment described herein. In the illustrated embodiment, the trim transistor P3 is coupled in parallel with the transistor P1, while the trim transistor P4 is coupled in parallel with the transistor P2. While FIG. 1B illustrates two trim transistors P3 and P4, any suitable number of trim transistors can be used on each side, coupled in parallel. In an embodiment, adding fewer trim transistors to the left side has the effect of mirroring less current to the left side, while adding more trim transistors to the left side has the effect of mirroring more current to the left side. If the same number of transistors are added to each side, this may be the equivalent of no trim. Adding the trim transistors P3 and P4 serves to rebalance or trim the sense amp, cancelling some of the effect of the mismatch errors discussed above. This trimming technique is generally discussed in U.S. Pat. No. 7,239,537. The discussion of trim transistors in this patent is herein incorporated by reference.

As discussed above, in essence trimming using the trim transistors P3 and P4 can allow the threshold data cell resistance to be moved back to a near ideal value on a sense amplifier by sense amplifier. But this has disadvantages. Trimming requires significant test time and circuit area. Further, trimming does not correct for FET parameter shifts which occur after initial test and trimming of the part. Still further, trimming cannot correct for transient noise effects, which are random in nature with respect to time.

Figure 2:
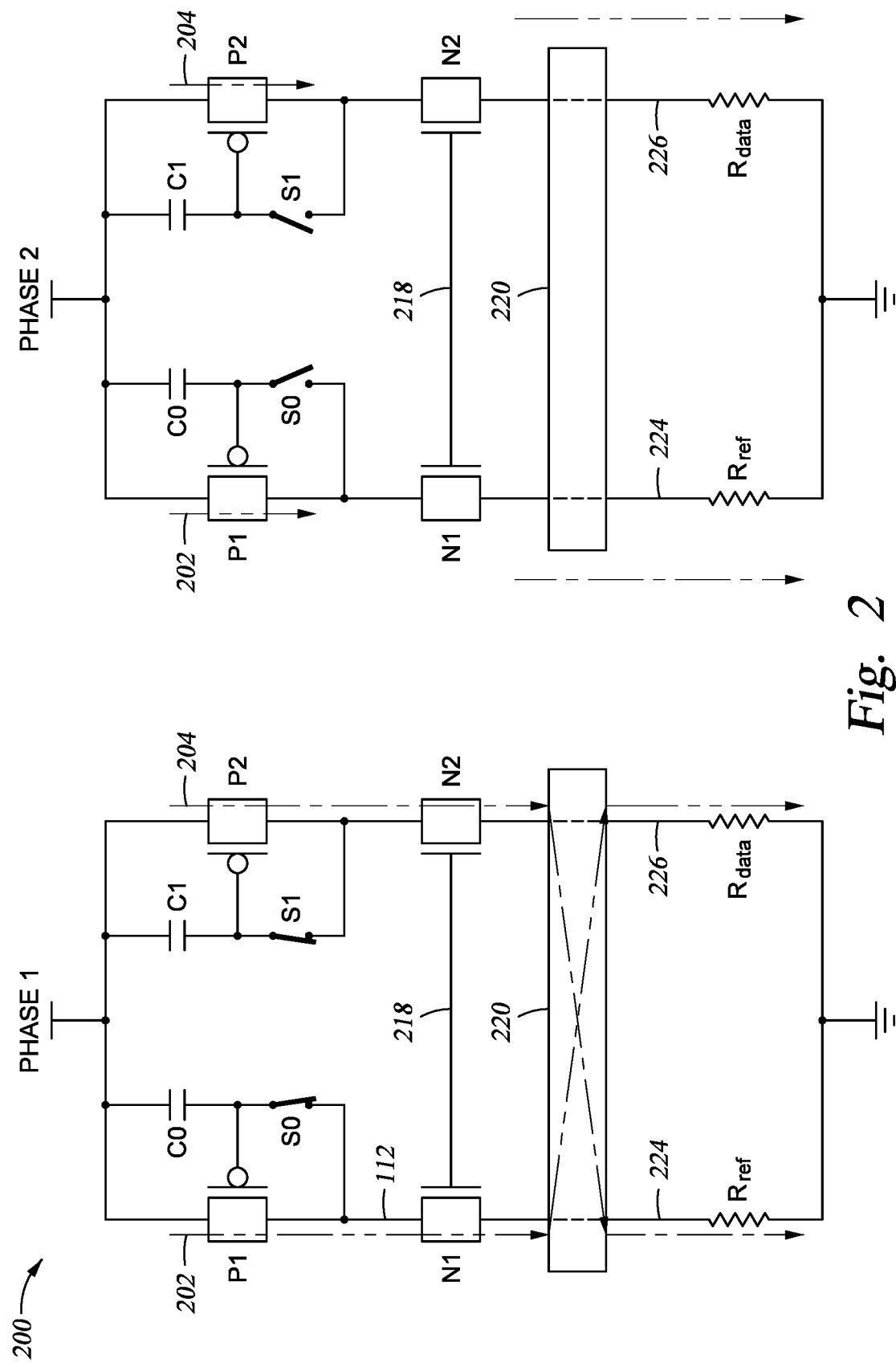
FIG. 2 illustrates a MRAM sense amplifier, according to one embodiment described herein.

FIG. 2 illustrates an MRAM sense amplifier 200, according to one embodiment described herein. In an embodiment, FIG. 2 addresses FET mismatch by introducing a 2 phase, "sample and hold" technique, as illustrated. In this solution, the data and reference loads are switched between the left and right legs of the sense amplifier 200 between phase 1 and 2, as the diode connections S0 and S1 coupled to the p-channel devices P1 and P2 are opened. The gate voltage of the p-channel device during phase 1 is stored on the capacitors C0 and C1. As a result, during phase 2 the load devices P1 and P2 become current sources based on the phase 1 load. That is, during phase 1 the capacitors C0 and C1 store the gate voltages of P1 and P2, respectively. During phase 2, the switches S0 and S1 open, and the p-channel transistors P1 and P2 become current sources.

Further, during phase 1 the p-channel transistor P1 sources the data current 202 while the p-channel transistor P2 sources the reference current 204. During phase 1 the column decoder/multiplexer 220 is configured to swap legs, so that the output from the n-channel transistor N1 is coupled to Rdata while the output from the n-channel transistor N2 is coupled to Rref. As above in FIGS. 1A-1B, the n-channel transistors N1 and N2 form a circuit that clamps the bit lines to the target read voltage at the clamp 218. The sense amplifier 200 includes a column decoder/multiplexer 220 and bit lines 224 and 226. The bit line 224 is a reference bit line while the bit line 226 is a data bit line.

This means that during phase 1, the reference current 204 flows through the right leg of the sense amplifier before reaching the column decoder/multiplexer 220, and the reference current is then swapped to flow through the resistor Rref. Further during phase 1 the data current 202 flows through the left leg of the sense amplifier before reaching the column decoder/multiplexer 220, and the reference current is then swapped to flow through the resistor Rdata. During phase 2, the column decoder/multiplexer 220 stops swapping legs, so that the data current 202 flows through the resistor Rref while the reference current 204 flows through the resistor Rdata.

Since the loads switch from phase 1 to 2, the source current, including the device pair mismatch current offsets of the left and right legs of the sense amplifier, are sourced to both the data and reference loads. This leads to a two times increase in signal and a cancellation of the device mismatch errors, compared to the techniques illustrated in FIG. 1.

Figure 3:
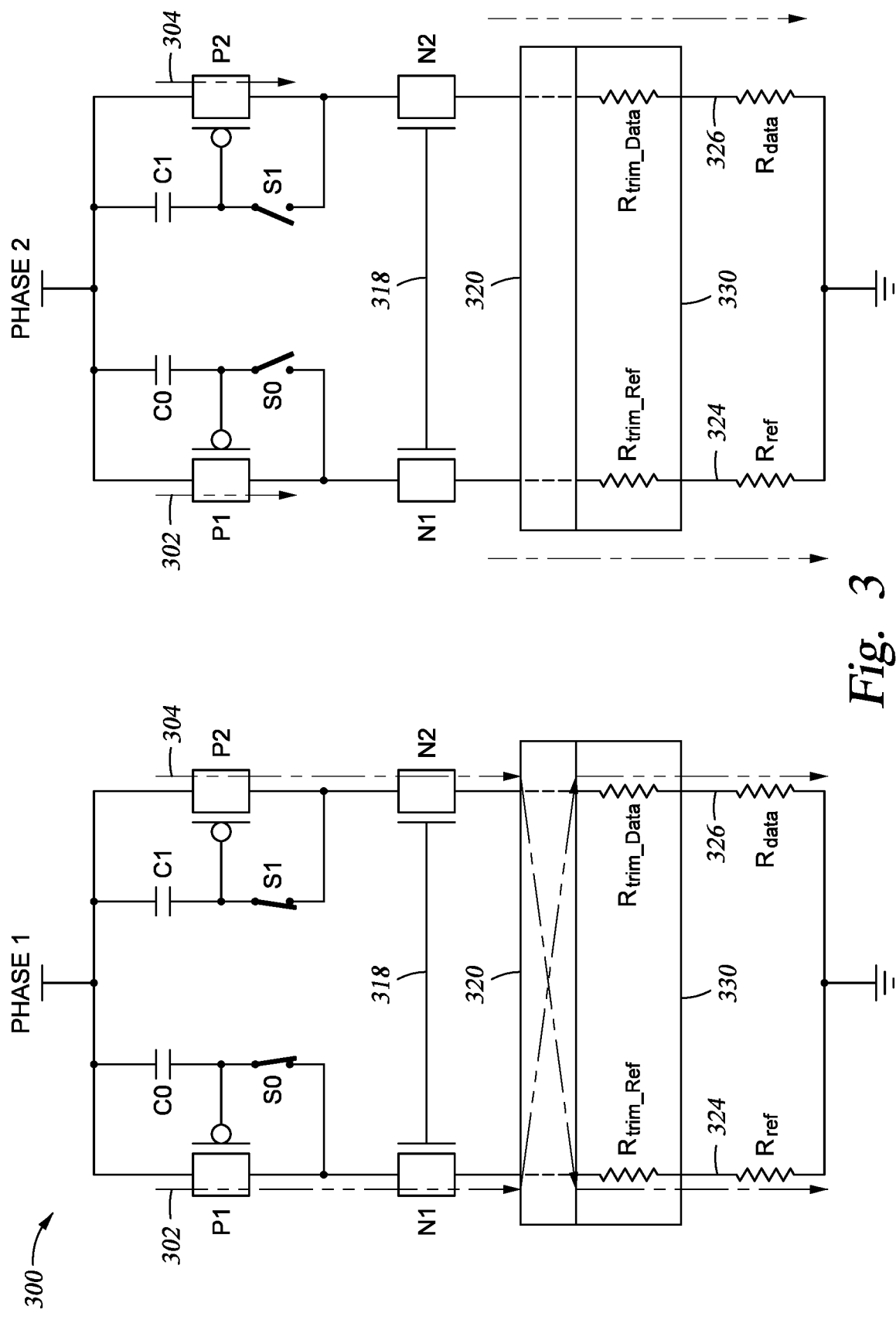
FIG. 3 illustrates a MRAM sense amplifier, according to one embodiment described herein.

FIG. 3 illustrates a further MRAM sense amplifier 300, according to one embodiment described herein. While the techniques illustrated in FIG. 2 serve to correct for some device mismatch errors, as discussed above, in some circumstances the device mismatch offsets are not completely cancelled with these techniques. Further prior trimming techniques (e.g., as illustrated with regard to FIG. 1B) do not cancel the remaining offset error, because the trimming effect is cancelled out by the 2 phase operation. The sense amplifier 300 can mitigate this problem by adding additional trim resistance elements 330, which are not cancelled out by 2 phase operation.

In an embodiment, the MRAM sense amplifier 300 uses the 2 phase, "sample and hold" technique, discussed above with regard to FIG. 2. In this solution, the data and reference loads are switched between the left and right legs of the sense amplifier 300 between phase 1 and 2, as the diode connections S0 and S1 coupled to the p-channel devices P1 and P2 are opened. The gate voltage of the p-channel device during phase 1 is stored on the capacitors C0 and C1. As a result, during phase 2 the load devices P1 and P2 become current sources based on the phase 1 load. That is, during phase 1 the capacitors C0 and C1 store the gate voltages of P1 and P2, respectively. During phase 2, the switches S0 and S1 open, and the p-channel transistors P1 and P2 become current sources. As above in FIG. 2, the n-channel transistors N1 and N2 form a circuit that clamps the bit lines to the target read voltage at the clamp 318.

Further, during phase 1 the p-channel transistor P1 sources the data current 302 while the p-channel transistor P2 sources the reference current 304. During phase 1 the column decoder/multiplexer 320 is configured to swap legs, so that the output from the n-channel transistor N1 is coupled to Rdata while the output from the n-channel transistor N2 is coupled to Rref. This means that during phase 1, the reference current 304 flows through the right leg of the sense amplifier before reaching the column decoder/multiplexer 320, and the reference current is then swapped to flow through the resistor Rref. Further during phase 1 the data current 302 flows through the left leg of the sense amplifier before reaching the column decoder/multiplexer 320, and the reference current is then swapped to flow through the resistor Rdata. During phase 2, the column decoder/multiplexer 320 stops swapping legs, so that the data current 302 flows through the resistor Rref while the reference current 304 flows through the resistor Rdata.

Since the loads switch from phase 1 to 2, the source current, including the device pair mismatch current offsets of the left and right legs of the sense amplifier, are sourced to both the data and reference loads. This leads to a two times increase in signal and a cancellation of much of the device mismatch error, compared to the techniques illustrated in FIG. 1A.

As discussed above, however, this does not cancel all of the device mismatch error. The MRAM sense amplifier 300 further includes resistance elements 330 to further address device mismatch offset errors. In an embodiment, the trim resistance elements 330 include resistive circuitry Rtrim_Ref in the reference path and Rtrim_Data in the data path. As discussed above, these resistance elements 330 serve to trim the devices, without being offset by the two-phase offset cancellation discussed above with regard to FIG. 2.

As illustrated, the resistance elements 330 are located between the column decoder/multiplexer 320 and the bitlines. For example, the resistive circuitry Rtrim_Ref is located between the column decoder/multiplexer 320 and the reference bitline 324. The resistive circuitry Rtrim_Data is located between the column decoder/multiplexer 320 and the data bitline 326. Because of this, the added trim resistance in series with either the reference bitline 324 or the data bitline 326 will be constant between the two phases of operation. In other words, the two phase cancellation operation does not null out the trim resistance. This allows the sense amp to be effectively trimmed.

In an embodiment, resistance is added to either the reference or data side, but not both simultaneously, to trim the operating point of the sense amp either up or down. This effectively moves the reference point of the sense amp either up or down, as further illustrated in FIGS. 4A-B, below.

Figure 4:
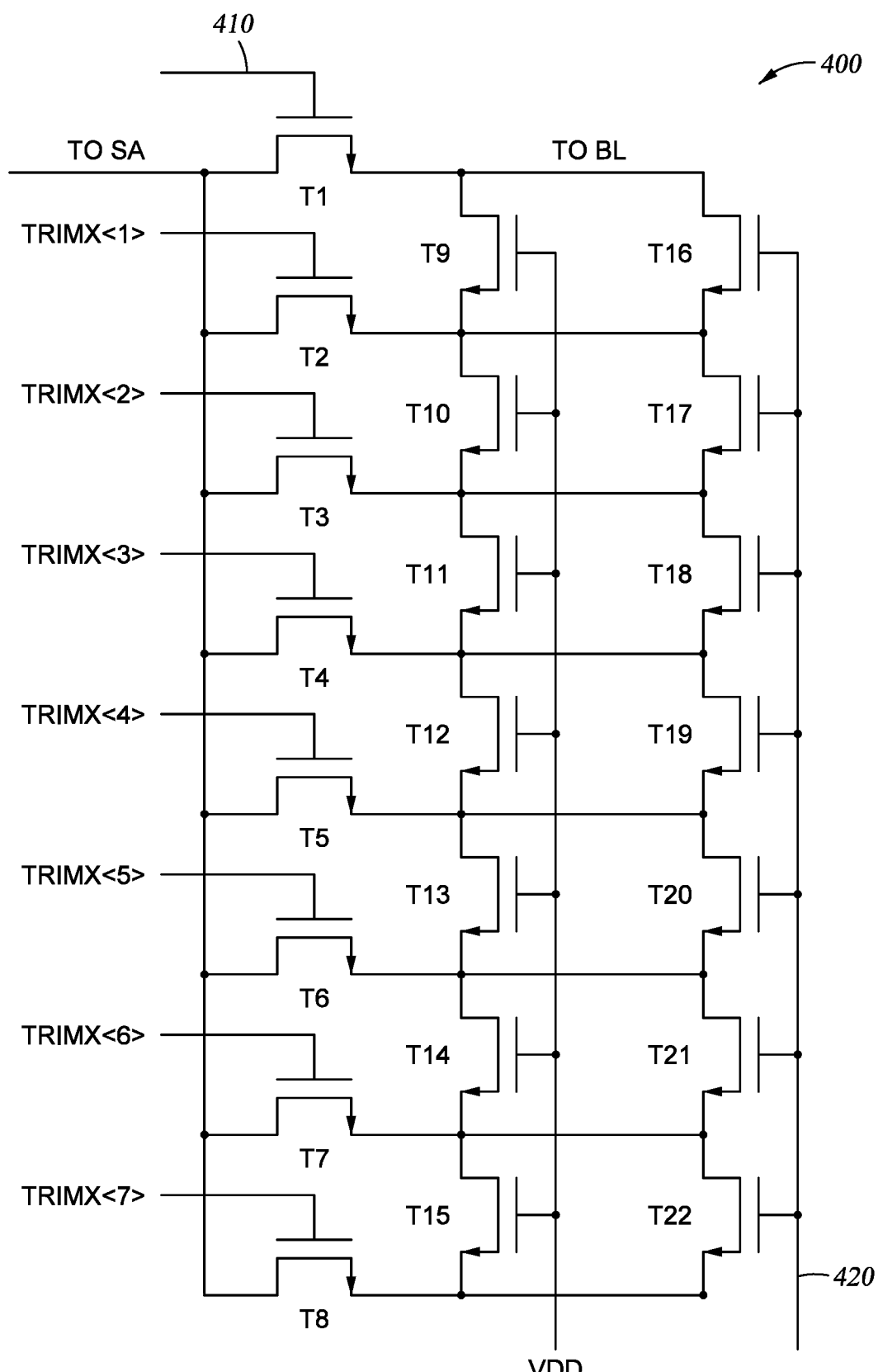
FIG. 4 illustrates resistive elements for use in a MRAM sense amplifier, according to one embodiment described herein.

FIG. 4 illustrates resistive elements for use in an MRAM sense amplifier, according to one embodiment described herein. As illustrated in FIG. 3, the resistive elements Rtrim_Ref and Rtrim_Data are each depicted as single resistive elements. But this is merely for ease of illustration. In an embodiment, each of Rtrim_Ref and Rtrim_Data are configurable resistance elements capable of providing a desired level of resistance.

For example, as illustrated in FIG. 4, a resistive element 400 is made up of a number of FETs T1-T22. These are coupled to allow for a variable level of resistance, depending on the input TRIMX. In an embodiment, TRIMX controls FETs T2-T8, thereby controlling the level of trim resistance. The embodiment illustrated in FIG. 4 includes FETs as resistive circuitry, but any suitable resistive circuitry could be used. For example, a poly resistor, fusion resistor, or any other suitable resistive circuitry could be used.

In the no trim state, the gate 410 is activated and "TO SENSE AMP (SA)" is connected "TO BIT LINE (BL)" on both the left and right sense amp sides. This is the null or no trim state. To trim, device T1 if turned off on either the data or reference side and one device T2-T8 is turned on. The resistance in series increases as the number of devices in series, T9-T15, increases. For example, if TRIMX<3> is high, the current path through the trimming are devices T4, T11, T10, and T9 in series.

The resistance per step is controlled by the size of FETs (or other suitable resistive elements) T9-T15. Another trim range is achieved by placing additional FETs (or other suitable resistive elements, T16-T22, in parallel with primary elements T9-T15. When activated using the input 420, the parallel combination of elements reduces the trim resistance per step and the total trim range. In the example with TRIMX<3> selected and input 420 also activated, the current path from SENSE AMP to BIT LINE becomes T4 and the parallel combination of T11, T10, and T9 with T18, T17, and T16.

Figure 5:
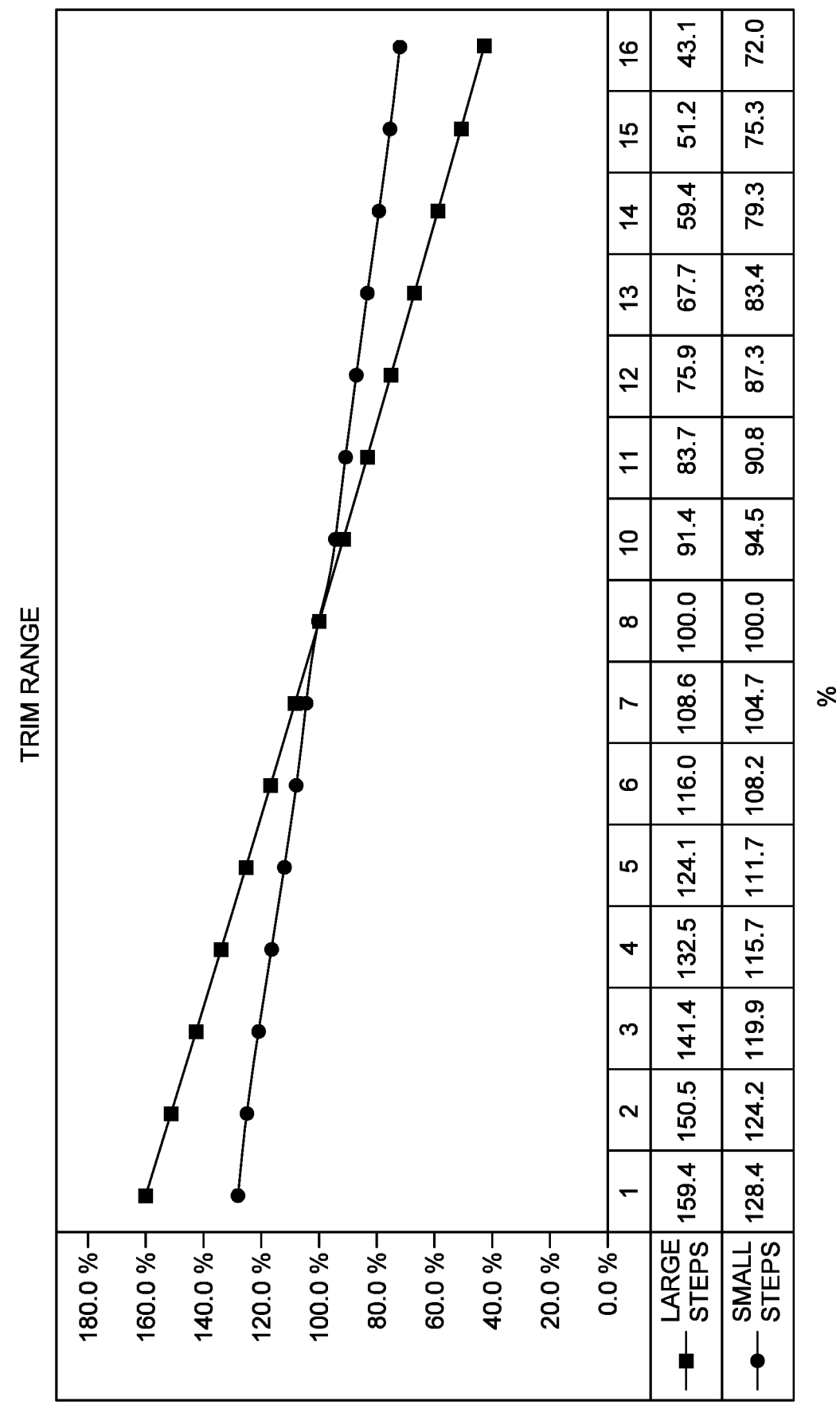
FIG. 5 illustrates trim resistance range for a number of steps of resistance elements, according to one embodiment described herein.

FIG. 5 illustrate trim resistance range for a number of steps of resistance elements, according to one embodiment described herein. FIG. 5 illustrates a four bit trim system with 16 steps. The middle of the range is step 8. This serves as the default, where no additional resistance is added to either leg. As resistance is added in one direction, the sense amp offsets to a higher resistance point. As resistance is added in the other direction, the sense amp offsets to a lower resistance point.

The x-axis represents the steps in trim range added. For example, as illustrated in FIG. 4, a configurable resistive element can be added with multiple different levels of resistance, on either the data leg (e.g., Rtrim_Ref illustrated in FIG. 3) or the reference leg (e.g., Rtrim_Data illustrated in FIG. 3). As illustrated in FIG. 5, there are 16 possible resistance steps. Further, these can be small steps or large steps (e.g., based on activating the input 420 in FIG. 4, as discussed above).

The y-axis in FIG. 5 represents the percent change in measurement by the sense amplifier after applying the trim. For example, at step 8 no resistance is added to either leg and the sense amplifier measures at 100%. At step 7, one step of resistance is added to either the reference leg (e.g., the resistance value of Rtrim_Data in FIG. 3 is increased by one step) or the data leg (e.g., the resistance value of Rtrim_Ref in FIG. 3 is increased by one step), but not both. This trim step changes the measurement of the sense amplifier to 104.7% (if the step is a small step) or to 108.6% (if the step is a large step). At step 6, another step of resistance is added to the same side (either Rtrim_Data or Rtrim_Ref), changing the measurement of the sense amplifier to 108.2% (for a small step) or 108.6% (for a large step).

Figure 6:
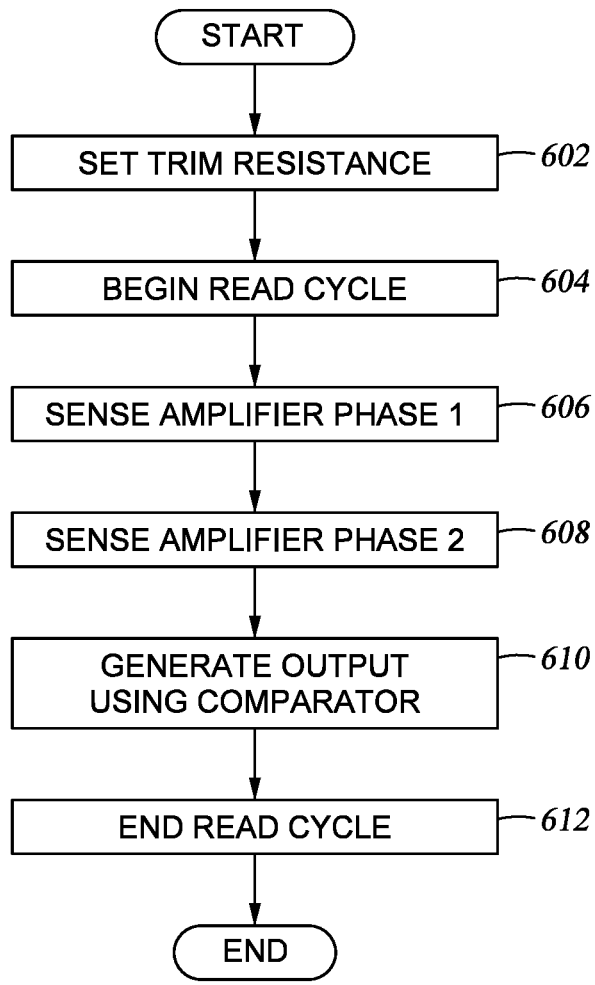
FIG. 6 is a flowchart illustrating a two phase MRAM sense amplifier, according to one embodiment described herein.

FIG. 6 is a flowchart illustrating a two phase MRAM sense amplifier, according to one embodiment described herein. For example, the flow illustrated in FIG. 6 corresponds with operation of the MRAM sense amplifiers illustrated in FIGS. 3 and 4. At block 602, the trim resistance is set. As discussed above with regard to FIGS. 3-5, in an embodiment a resistive element (e.g., Rtrim_Ref or Rtrim_Data illustrated in FIG. 3) can be used to offset device mismatch errors. In an embodiment, the resistance provided by this resistive element is configurable (e.g., as discussed with regard to FIG. 4). At block 602, the level of resistance in either Rtrim_Ref or Rtrim_Data is set.

At block 604, a read cycle begins. At block 606, the sense amplifier undertakes phase 1. As discussed above in relation to FIG. 2, data and reference loads in the sense amplifier are switched between the left and right legs between phase 1 and 2, as switches coupled to the p-channel transistors open. During phase 1, the switches are closed and a multiplexer swaps the data and reference loads across legs of the sense amplifier (e.g., from a left leg to a right leg, and vice-versa). Further, as discussed in relation to FIG. 3, the resistive elements Rtrim_Ref and Rtrim_Data serve to further offset errors.

At block 608, the sense amplifier undertakes phase 2. In this phase, the switches coupled to the p-channel transistors are open and the multiplexer no longer swaps the data and reference loads between legs. This compensates for any FET mismatch between the pairs of n-channel and p-channel transistors. Further, as discussed above with regard FIG. 3, the resistive elements Rtrim_Ref and Rtrim_Data serve to further offset errors.

At block 610, a comparator generates the digital output by comparing input voltages. For example, as illustrated in FIG. 1 a comparator can compare the output voltages of the p-channel transistors on each leg of the sense amplifier, and can correspondingly output a "0" or "1" depending on the voltage difference. This represents the data stored in the memory cell. At block 612, the read cycle ends.

FIG. 7 illustrates an example computer 700, according to one embodiment described herein. Various methods, procedures, modules, flow diagrams, tools, applications, circuits, elements, and techniques discussed herein may also incorporate and/or utilize the capabilities of the computer 700. Moreover, capabilities of the computer 700 may be utilized to implement features of exemplary embodiments discussed herein. One or more of the capabilities of the computer 700 may be utilized to implement, incorporate, to connect to, and/or to support any element discussed herein (as understood by one skilled in the art) in FIGS. 1-6.

Generally, in terms of hardware architecture, the computer 700 may include one or more processors 710, computer readable storage memory 720, and one or more input and/or output (I/O) devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a data signal processor (DSP), or an auxiliary processor among several processors associated with the computer 700, and the processor 710 may be a semiconductor based microprocessor (in the form of a microchip) or a microprocessor. Note that the memory 720 can have a distributed architecture, where various components are situated remote from one another, but can be accessed by the processor 710. In an embodiment, the memory 720 can be formed using MRAM and using MRAM sense amplifiers as discussed in one or more embodiments herein.

The software in the computer readable memory 720 may include one or more separate programs, each of which comprises an ordered listing of executable instructions for implementing logical functions. The software in the memory 720 includes a suitable operating system (O/S) 750 and one or more applications 760 of the exemplary embodiments. As illustrated, the application 760 comprises numerous functional components for implementing the features, processes, methods, functions, and operations of the exemplary embodiments. The application 760 of the computer 700 may represent numerous applications, agents, software components, modules, interfaces, controllers, etc., as discussed herein but the application 760 is not meant to be a limitation.

The operating system 750 may control the execution of other computer programs, and provides scheduling, input-output control, file and data management, memory management, and communication control and related services.

The I/O devices 770 may include input devices (or peripherals) such as, for example but not limited to, a mouse, keyboard, scanner, microphone, camera, etc. Furthermore, the I/O devices 770 may also include output devices (or peripherals), for example but not limited to, a printer, display, etc. Finally, the I/O devices 770 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or an intranet. The I/O devices 770 may be connected to and/or communicate with the processor 710 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

It is understood that the computer 700 includes non-limiting examples of software and hardware components that may be included in various devices, servers, and systems discussed herein, and it is understood that additional software and hardware components may be included in the various devices and systems discussed in exemplary embodiments.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A sense amplifier circuit for sensing a data state of a data cell, comprising:
    a first leg comprising a first transistor and a second leg comprising a second transistor, wherein the sense amplifier circuit is configured to perform a two-phase read comprising:
        a first phase in which the first transistor is coupled to a reference resistance circuitry and the second transistor is coupled to a data resistance circuitry, and
        a second phase in which the first transistor is coupled to the data resistance circuitry and the second transistor is coupled to the reference resistance circuitry;
    a reference trim circuitry coupled to the reference resistance circuitry and a data trim circuitry coupled to the data resistance circuitry, the reference trim circuitry and data trim circuitry configured to correct for device mismatch errors relating to the two-phase read of the sense amplifier circuit; and
    a comparator circuit configured to output the data state of the data cell based on input of a first voltage related to a reference resistance and a second voltage related to a data resistance.

2. The sense amplifier circuit of claim 1, wherein the reference trim circuitry and the data trim circuitry are both resistive circuitry.

3. The sense amplifier circuit of claim 2, wherein the reference trim circuitry is configured in series with the reference resistance circuitry and a reference bitline.

4. The sense amplifier circuit of claim 3, wherein the data trim circuitry is configured in series with the data resistance circuitry and a data bitline.

5. The sense amplifier circuit of claim 2, wherein the resistance provided by the reference trim circuitry and the resistance provided by the data trim circuitry are each independently configurable.

6. The sense amplifier circuit of claim 5, wherein the reference trim circuitry comprises a first plurality of resistive circuitry elements and wherein increasing a number of resistive circuitry elements in the first plurality increases the trim resistance for the sense amplifier circuit.

7. The sense amplifier circuit of claim 6, wherein the number of resistive circuitry elements in the first plurality of resistive circuitry elements relates to a number of steps in a trim range for the sense amplifier circuit.

8. The sense amplifier circuit of claim 7, wherein the reference trim circuitry further comprises a second plurality of resistive circuitry elements connected in parallel with the first plurality of resistive circuitry elements, wherein the sense amplifier circuit is configured to control activation of the second plurality of resistive circuitry elements, and wherein activation of the second plurality of resistive circuitry elements reduces the resistance added by each trim step in the trim range.

9. The sense amplifier circuit of claim 6, wherein the first plurality of resistive circuitry elements comprise Field Effect Transistors (FETs).

10. The sense amplifier circuit of claim 2, wherein increasing the resistance provided by the reference trim circuitry relative to the data trim circuitry modifies operation of the sense amplifier circuit to decrease device mismatch error in the sense amplifier circuit.

11. The sense amplifier circuit of claim 2, wherein configuring the reference trim circuitry and the data trim circuitry to provide the same resistance results in a no-trim state for the sense amplifier circuit.

12. A magnetoresistive random access memory (MRAM) system, comprising:
   a plurality of MRAM data cells; and
   a sense amplifier circuit for sensing a data state of a data cell of the plurality of MRAM data cells, the sense amplifier circuit comprising:
      a first leg comprising a first transistor and a second leg comprising a second transistor, wherein the sense amplifier circuit is configured to perform a two-phase read comprising:
         a first phase in which the first transistor is coupled to a reference resistance circuitry and the second transistor is coupled to a data resistance circuitry, and
         a second phase in which the first transistor is coupled to the data resistance circuitry and the second transistor is coupled to the reference resistance circuitry;
      a reference trim circuitry coupled to the reference resistance circuitry and a data trim circuitry coupled to the data resistance circuitry, the reference trim circuitry and data trim circuitry configured to correct for device mismatch errors relating to the two-phase read of the sense amplifier circuit; and
      a comparator circuit configured to output the data state of the data cell based on input of a first voltage related to a reference resistance and a second voltage related to a data resistance.

13. The MRAM system of claim 12,
   wherein the reference trim circuitry and the data trim circuitry are both resistive circuitry,
   wherein the reference trim circuitry is configured in series with the reference resistance circuitry and a reference bitline, and
   wherein the data trim circuitry is configured in series with the data resistance circuitry and a data bitline.

14. The MRAM system of claim 12,
   wherein the resistance provided by the reference trim circuitry and the resistance provided by the data trim circuitry are each independently configurable,
   wherein the reference trim circuitry comprises a first plurality of resistive circuitry elements, and
   wherein increasing a number of resistive circuitry elements in the first plurality increases the trim resistance for the sense amplifier circuit.

15. The MRAM system of claim 14,
   wherein the number of resistive circuitry elements in the first plurality of resistive circuitry elements relates to a number of steps in a trim range for the sense amplifier circuit,
   wherein the reference trim circuitry further comprises a second plurality of resistive circuitry elements connected in parallel with the first plurality of resistive circuitry elements,
   wherein the sense amplifier circuit is configured to control activation of the second plurality of resistive circuitry elements, and
   wherein activation of the second plurality of resistive circuitry elements reduces the resistance added by each trim step in the trim range.

16. A method of reading data from a magnetoresistive random access memory (MRAM) system, comprising:
   performing a two phase read of a data state of a data cell using a sense amplifier circuit, the sense amplifier circuit comprising:
      a first leg comprising a first transistor;
      a second leg comprising a second transistor;
      a reference trim circuitry;
      a data trim circuitry; and
      a comparator circuit;
   wherein during a first phase of the two phase read the first transistor is coupled to a reference resistance circuitry and the second transistor is coupled to a data resistance circuitry,
   wherein during a second phase of the two phase read the first transistor is coupled to the data resistance circuitry and the second transistor is coupled to the reference resistance circuitry,
   wherein the reference trim circuitry is coupled to the reference resistance circuitry and the data trim circuitry is coupled to the data resistance circuitry, the reference trim circuitry and data trim circuitry configured to correct for device mismatch errors relating to the two phase read of the sense amplifier circuit, and
   wherein the comparator circuit is configured to output the data state of the data cell based on input of a first voltage related to a reference resistance and a second voltage related to a data resistance.

17. The method of claim 16,
   wherein the reference trim circuitry and the data trim circuitry are both resistive circuitry,
   wherein the reference trim circuitry is configured in series with the reference resistance circuitry and a reference bitline, and
   wherein the data trim circuitry is configured in series with the data resistance circuitry and a data bitline.

18. The method of claim 16,
wherein the resistance provided by the reference trim circuitry and the resistance provided by the data trim circuitry are each independently configurable,
wherein the reference trim circuitry comprises a first plurality of resistive circuitry elements, and
wherein increasing a number of resistive circuitry elements in the first plurality increases the trim resistance for the sense amplifier circuit.

19. The method of claim 18,
wherein the number of resistive circuitry elements in the first plurality of resistive circuitry elements relates to a number of steps in a trim range for the sense amplifier circuit,
wherein the reference trim circuitry further comprises a second plurality of resistive circuitry elements connected in parallel with the first plurality of resistive circuitry elements,
wherein the sense amplifier circuit is configured to control activation of the second plurality of resistive circuitry elements, and
wherein activation of the second plurality of resistive circuitry elements reduces the resistance added by each trim step in the trim range.

20. The method of claim 16,
wherein the reference trim circuitry and the data trim circuitry are both resistive circuitry, and
wherein increasing the resistance provided by the reference trim circuitry relative to the data trim circuitry modifies operation of the sense amplifier circuit to decrease device mismatch error in the sense amplifier circuit.

* * * * *